Feb. 24, 1970 GORDON KOWA CHENG CHEN 3,496,631

MANUFACTURE OF SEMI-CONDUCTOR DEVICES

Filed Feb. 8, 1967 2 Sheets-Sheet 1

INVENTOR.
GORDON KOWA CHENG CHEN
BY Maybee & Legris
ATTORNEYS

INVENTOR.
GORDON KOWA CHENG CHEN
BY~ Maybee & Legris
ATTORNEYS

United States Patent Office 3,496,631
Patented Feb. 24, 1970

3,496,631

MANUFACTURE OF SEMI-CONDUCTOR DEVICES

Gordon Kowa Cheng Chen, Toronto, Ontario, Canada (1976 Victoria Park Ave., Scarborough, Ontario, Canada)

Filed Feb. 8, 1967, Ser. No. 614,737
Int. Cl. B01j *17/00;* H01l *5/00*
U.S. Cl. 29—577 8 Claims

ABSTRACT OF THE DISCLOSURE

Electrical connections are made to a semiconductor, having a surface passivation layer, by: forming a glass layer over the passivation layer, the glass layer being bonded to the passivation layer; forming windows in the glass layer so as to expose the passivation layer at the points to which connections are to be made; locating glazed conductors upon the glass layer with part of each conductor contacting the passivation layer through the window; and firing the assembly to form a unitary vitreous structure. The passivation layer preferably remains unbroken so that the semiconductor itself remains sealed during the whole process.

This invention relates to semiconductor devices and to methods of making such devices.

A semiconductor device is an electronic device in which the characteristic distinguishing electronic conduction takes place within a semiconductor. Such devices include silicon and germanium transistors, rectifiers and gating switches, and the methods and structures described herein are applicable to all such devices.

An active semiconductor element is produced when at least one junction is formed in a semiconductor crystal, a junction being a transition region between two semiconducting regions with different electrical properties. The three principle processes for forming junctions are growing, alloying and diffusion, the last-mentioned process being particularly important on account of its suitability for large scale production.

In the known production of one type of silicon transistor by the diffusion process, for example, a p-type or n-type silicon crystal, usually about one inch in diameter and four to six inches in length, is cut into wafers of from 0.01 inch to 0.02 inch thick. The wafers are lapped and polished to a very fine surface finish. After careful cleaning a layer of silicon dioxide of from 4,000 to 20,000 angstrom units thick is grown on the surface of the wafer at a temperature of about 1,000° C. This layer, herein referred to as a passivation layer, serves as a mask during subsequent diffusion processes. The area of semiconductor into which an impurity is to be diffused is exposed by selectively opening the passivation layer by etching with an etchant consisting of hydrofluoric and nitric acids; the etching pattern is produced by a photoresist method. On a single wafer many hundreds of such windows may be formed at the same time, the number of windows depending upon the number of semiconductor devices to be formed in the wafer. Junctions are formed by diffusing into the silicon body, at each of its exposed areas, an impurity material of opposite conductivity type to that of the silicon; for example, boron would be a suitable impurity material in the case of n-type silicon. Such diffusion is usually carried out at about 1,000° C. to a depth of a few micro-inches. By reforming the oxide or passivation layer and forming other windows therein of smaller area than the first windows, and diffusing another impurity material through these windows, multiple junction devices such as n-p-n transistors, silicon controlled rectifiers, or gating switches, may be formed.

The rapid growth of the semiconductor industry in the last few years has been mainly due to the suitability of the diffusion process, as described above, to batch processing. Very many individual devices may be formed on one semiconductor wafer one inch in diameter. At each step in the process all the individual devices are treated simultaneously.

However, it has not been possible hitherto to carry the batch process through to the completion of manufacture of the semiconductor devices, the main manufacturing difficulty being that of making electrical connections to the semiconductor body at the required positions.

In the known techniques, before the electrical connections can be made it is necessary to reopen the passivation layer at the required positions and then a thin metallic film is deposited on the wafer surface, the metal being removed at those positions where electrical connections are not required. This is the last step in which a batch of devices can be treated together. Thereafter the wafer is divided to separate the individual devices, which are treated individually. Electrical connections are made by welding very fine conducting leads to the deposited metal films, a protective glass layer having previously been formed over each device, and finally the devices are encapsulated.

It will be observed that the last part of the manufacturing process is highly inefficient compared with the first part. Moreover, quite apart from economic considerations, this process gives rise to two serious technical problems: first, in order to make the electrical connections it is necessary to expose areas of the semiconductor, thereby increasing the risk of contamination which might affect its electrical propertes, and second, the electrical leads are extremely fragile and very vulnerable to damage.

The present invention provides an improved method of making electrical connections to semiconductor bodies, in which the above problems are largely overcome. The method is especially suitable for the batch production of miniaturised components.

According to the invention, electrical connections are made to a semiconductor body on whose surface a passivation layer has been formed, by forming a layer of glass over the passivation layer, removing glass from the glass layer to expose the passivation layer at the points at which connections are to be made, locating glazed conductors, which may be green glazed conductors, on the surface of the glass layer with the conductors contacting the exposed areas of the passivation layer, and curing or firing the assembly so that the glazed conductors become bonded to the glass layer, and form a unitary vitreous structure therewith parts of the conductors dispersing through the passivation layer at the exposed areas. It is an important feature of the invention that the passivation layer, which preferably has a thickness of at least 4,000 angstrom units at its thinnest place, should not be broken. After firing, the passivation layer forms at the exposed areas conductive transition regions between the conductors and the semiconductor.

In this specification the term "green glazed conductor" means a composition containing conductive particles, vitreous or glass-forming components, and a binding medium, the composition being capable of being cured or fired to form a glass or glass-like body rendered conductive by its metal contents. The term "glazed conductor" means the glass or glass-like body formed by the curing or firing process, but where the context permits includes a green glazed conductor.

Such a glazed conductor consists of conductive particles embedded in a glass matrix forming a vitreous body that is conductive to electricity. The material is usually formed by mixing metallic or metal oxide particles in pulverized glass or glass-forming components, a binder being added to make a paste. The paste is applied to a base or substrate in a particular design by stencilling, brushing or spraying; the printed base or substrate is heated to melt the glass which, upon cooling, becomes a thin vitreous conductor firmly bonded to the base or substrate. The ressistance of the conductor is determined primarily by its geometrical shape. The shape is usually obtained by printing the green glazed conductor through a stencil screen, or by cutting the cured film with abrasives, or by selectively etching away areas of the cured film by a photoresist process.

The invention will now be described, by way of example, with reference to the accompanying drawings, in which.

Figure 1:
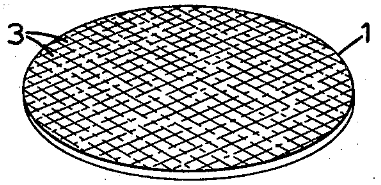
FIGURE 1 is a perspective view of a silicon wafer in which a large number of double diffused junctions have been formed.
Figure 2:
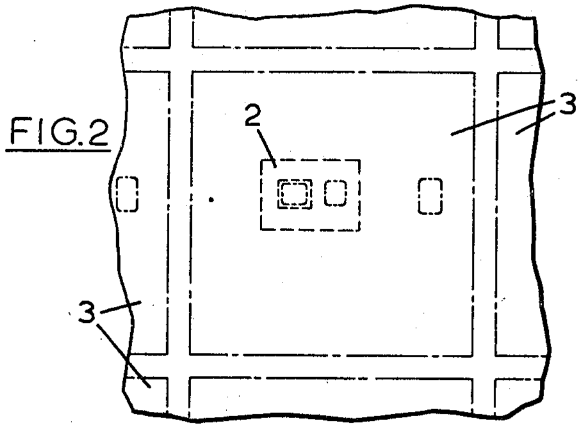
FIGURE 2 is an enlarged plan view of a fragment of the wafer, showing grid lines therein.

Referring to FIGURES 1 and 2, a wafer 1 of n-type silicon, or other semiconducting material having p-type or n-type properties, is formed with a large number of double-diffused junctions 2 by the diffusion method described above. The wafer 1 is separable into separate elements 3, each element including one double-diffused junction 2. A layer of silicon dioxide, i.e. a passivation layer, is formed on th surface of the wafer. The passivation layer may be formed during the final diffusion step by the addition of oxygen, or by an additional step of oxidation by thermal growth, or evaporation or reactive sputtering. It is desirable that the passivation layer should have a thickness of at least 4,000 angstrom units at its thinnest place.

Figure 3:
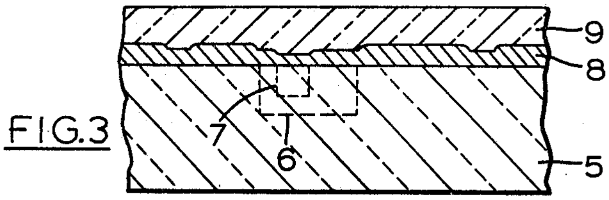
FIGURES 3–7 illustrate successive stages during the formation of a silicon transistor device, FIGURE 6 being a fragmentary plan veiw and FIGURES 3, 4, 5 and 7 being fragmentary sectional views.

A layer of glass is next formed upon the passivation layer. The glass layer, which is only a few micro-inches thick, may be formed by applying pulverized glass particles of 0.1 micron average size, the particles being deposited from a liquid carrier such as ethyl acetate and isopropyl alcohol by spin coating or sedimentation. The glass layer is made vitreous and firmly bonded to the passivation layer by known glass processing techniques. The detailed structure of a section of the wafer after formation of the glass layer is illustrated in FIGURE 3. This figure shows a body of n-type silicon 5, which is to form the collector of an n-p-n transistor, a p-type region 6 which is to form the base of the transistor and a further n-type region 7 within the region 6, which further n-type region is to form an emitter. On the surface of the silicon body 5 is the passivation layer of silicon dioxide 8, the thickness of which varies because of its previously having been used as a masking layer during the diffusion process. The glass layer 9 covers the passivation layer 8.

The glass of the layer 9 is selected so that its coefficient of thermal expansion will match that of the silicon dioxide layer; this does not require that the two coefficients shall be equal, but only that their difference shall not be so great as to produce excessive strain at the interface between the layers. This consideration limits the thickness of the glass layer applied. Many commercially available glasses may be used; for example, an aluminosilicate glass similar to the Corning code 1720 having a coefficient of thermal expansion of $42\times10^{-7}/°$ C., a density of 2.5 gm./cm.$^3$, and a softening point of about 900° C., is suitable in the case of a silicon dioxide passivation layer grown thermally in dry oxygen.

Figure 4:
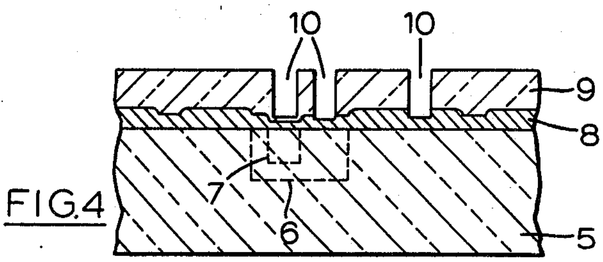

As illustrated in FIGURE 4, windows 10 are formed in the glass layer 9 at those points at which electrical connections are to be made to the collector, base and emitter regions. The windows are formed by removing glass from the layer 9 by etching, using a photoresist technique to mask the wafer. The etching can be performed by immersion in 1.8 molar hydrofluoric acid, or exposure to hydrofluoric acid vapour.

It is important that areas of the passivation layer 8 shall be exposed by the formation of the windows 10, but that the layer 8 shall itself remain unbroken so that the silicon surface is not exposed.

Since the silicon dioxide layer may be partially etched by the etchant, care must be exercised to ensure that the passivation layer is not etched through.

It will be particularly noted that the silicon surface at this stage is completely sealed from its environment by the layer 8, and in this respect the process according to the present invention is fundamentally different from known processes, which require that the semiconductor surface shall be exposed in order that electrical connections to it may be made.

The next step is to prepare and apply green glazed conductors to the surface of the glass layer. The conductor material is prepared in accordance with standard practice, but the selection of the glass matrix material and the conductive particles is critical. The glass matrix material must be compatible with the glass layer 9 as well as with the conductive particles it contains. The conductive particles must be chemically stable and inert to normal atmosphere, and for this reason noble metals are preferred. In order to obtain ohmic as opposed to rectifying contacts, platinum is preferred to gold. Depending upon the type of semi-conductor, the metal particles may be selected from gold, silver, platinum, or osmium. Commercial glasses, such as the Corning pyroceram with a softening point of 400° C. may be used, but generally a boro-silicate glass having a density of 2.1 gm./cm.$^3$, a coefficient of thermal expansion of $32\times10^{-7}/°$ C., and a softening point of 700° C., is preferred.

Figure 6:
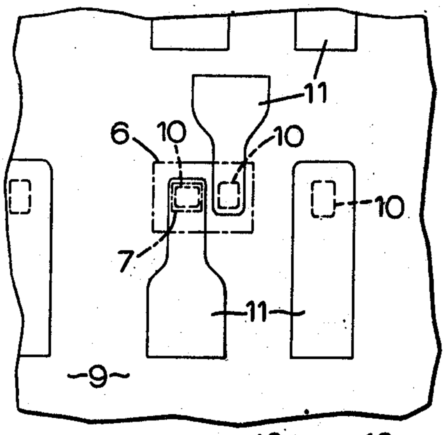
Figure 5:
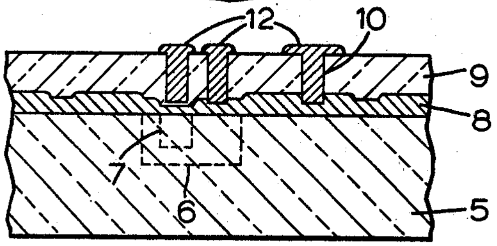

The matrix glass and metallic components are reduced to particles of one micro-inch average size and are formed into a thin paste, or green glaze, by adding an organic carrier such as nitrocellulose diluted with amyl acetate. The green glaze is applied to the surface of the wafer, by a stencilling or photoresist technique, to form the pattern of connections shown in FIGURES 5 and 6. It will be seen from FIGURE 6 that the area of the green glazed conductor 11 increases outside the area 2 of the double-diffused junction, thereby facilitating the subsequent attachment of relatively strong leads. It will be noted that the green glazed conductors 11 are located upon the surface of the glass layer 9 in a regular predetermined pattern, with the ends of the conductors entering the windows 10 and contacting the exposed areas of the passivation layer at the points to which the electrical connections are to be made.

Figure 7:
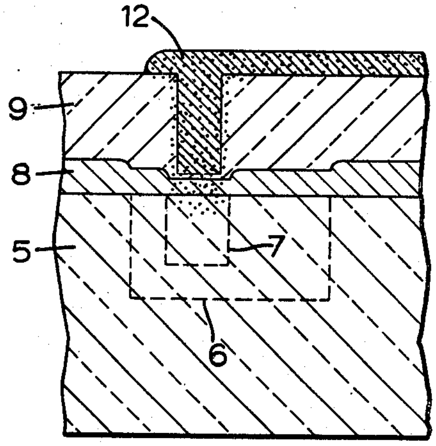

The assembly so formed is next cured or fired at a temperature above 600° C. in normal atmosphere. The curing process results in the formation of a unitary vitreous structure, a detail of which is shown in section in FIGURE 7. This figure shows a section taken in a plane at right angles to the sectional plane of FIGURE 5, and is further magnified. The bonds between the glazed conductor 12, the glass layer 9, the passivation layer 8 and the regions of the silicon body 5, 6 and 7, are achieved by chemical reaction at their respective interfaces. Each interface becomes a transition region as a result of the curing step, the glazed conductors becoming an integral part of the glazed structure and a part of each conductor, namely the metallic particles, being dispersed through the passivation layer into the appropriate region of the semiconductor. Thus the parts of the passivation layer beneath the windows of the glass layer become transition regions between the conductors and the silicon body.

The wafer can now be broken into individual elements or transistors. Each element is a unitary structure in which the silicon body 5 is hermetically sealed by an unbroken passivation layer 8, a layer of glass 9 covering and being bonded to the passivation layer. The glass layer has windows 10 therein which expose separate areas of the passivation layer at different regions 5, 6 and 7 of the silicon body, and electrodes constituted by the glazed conductors 12 make ohmic contact with the respective regions by being dispersed through the exposed parts of the passivation layer 8.

The present invention makes possible the mass production of semiconductor devices by an automated process because of the rugged nature of the electrodes and absence of delicate wire connections.

Figure 8:
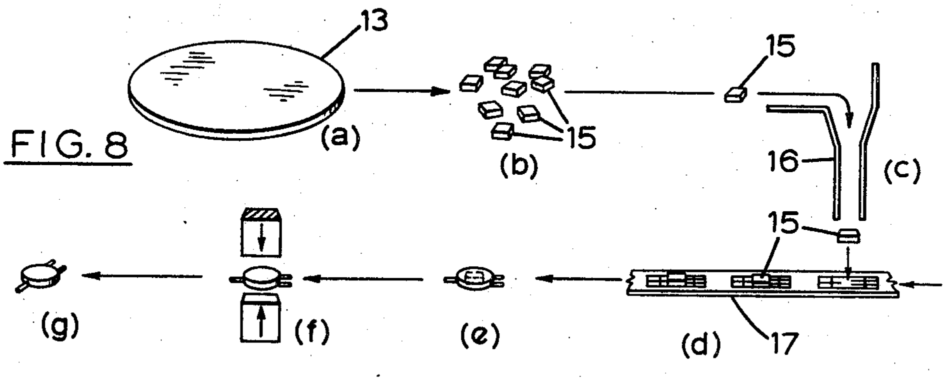
FIGURE 8 is a schematic flow diagram illustrating stages in the automatic assembly of silicon transistors according to the invention.

Referring to FIGURE 8, the finally cured wafer assembly 13, comprising a large number of individual elements, is first dipped in solder and then divided into individual dice 15. The dice 15 are oriented by a conventional alignment chute 16 prior to mounting on a ribbon lead 17. The ribbon lead, which is indexed, carries the dice through solder reflow, encapsulation, stamping, testing, sorting, labelling and packaging stages. All these processes are carried out on an assembly of in-line machines, an operator being required only to supervise and maintain operation of the machines.

Figure 9:
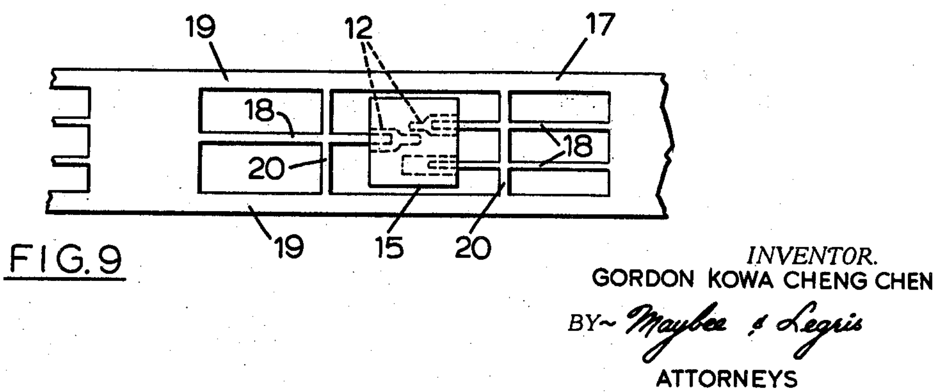
FIGURE 9 shows a detail of a ribbon lead shown in FIGURE 8.

FIGURE 9 shows a detail of the ribbon lead 17, with a silicon element superimposed to show the relationship of the electrodes 12 and external connections 18 of the ribbon lead. It will be seen that the ribbon lead 17 comprises a border 19 enclosing a grid-like pattern of the connections 18 with transverse supporting strips 20.

The electrodes provided on devices made in accordance with the present invention are, because of their strong adhesion to the semiconductor, better and more reliable than the conventional electrodes commonly provided. The more massive glazed conductor has a lower resistance and greater current carrying capacity than a conventional thin film—thin wire electrode. Since the glazed conductor makes contact with the semiconductor uniformly over the entire terminal area, there is less current concentration and less chance of forming hot spots. The surface leakage current is reduced and the breakdown voltage increased, because of the completeness of the hermetic seal. Also, the device is better suited to withstand shock, vibration, and thermal cycling.

Mechanically, the device is stronger than a comparable device of conventional manufacture, and lighter because of the elimination of a mounting header. The provision of glazed conductors affords considerable freedom of body design.

From a manufacturing point of view, devices made in accordance with the invention are well suited to automated mass production techniques, whereas conventional devices are not so suited because of their inherent fragility.

In this specification the term "glass" is not limited to compositions including silica and silicates, but includes certain other glass-like materials such as silicon nitride, for example. The essental property of a "glass," as the term is used herein, is that it is rigid at normal temperatures but can be softened at higher temperatures and bonded to another glass by reacting with it chemically at the interface to form a unitary structure.

Although the invention has been particularly described by way of example with reference to silicon transistors of the n-p-n or p-n-p types, the invention is not limited thereto but is equally applicable to the manufacture of any semiconductor device comprising a body of semiconductor material coated with a passivation layer, a superimposed glass layer, and having at least one electrode formed by a glazed conductor. The passivation layer may be broken to expose the semiconductor, to which the glazed conductor is bonded, but preferably the passivation layer remains unbroken and the conductive component of the glazed conductor disperses through it.

What I claim as my invention is:

1. A method of making a semiconductor device comprising the steps of forming a passivation layer upon the surface of a semiconductor, forming a layer of glass over the passivation layer, the glass layer being bonded to the passivation layer, forming windows in the glass layer by removing glass therefrom to expose the passivation layer at points at which electrical connections are to be made, locating glazed conductors on the surface of the glass layer with the conductors contacting the passivation layer at said points, and curing the assembly to bond the glazed conductors to the glass layer, parts of the conductor dispersing through the unbroken passivation layer at the points at which they contact the passivation layer.

2. A method of making an electrical connection to the surface of a semiconductor body at a predetermined point thereof, said surface being coated with a passivation layer, which method comprises the steps of forming a layer of glass over the passivation layer the glass layer being bonded to the passivation layer, removing glass from the glass layer to expose the passivation layer at said point, locating a glazed conductor on the surface of the glass layer with the conductor contacting the exposed area of the passivation layer, and curing the assembly to bond the glazed conductor to the glass layer, part of the conductor dispersing through the unbroken passivation layer at the exposed area thereof.

3. The method claimed in claim 2, wherein the semiconductor body is silicon and the passivation layer is a layer of silicon dioxide grown thereon.

4. The method claimed in claim 3, wherein the passivation layer has a minimum thickness of at least 4,000 angstrom units.

5. The method claimed in claim 2, wherein the glass is removed by etching from the glass layer to expose the passivation layer at said point.

6. In the manufacture of a silicon transistor comprising a silicon wafer having a plurality of electrodes making ohmic contact with different regions thereof, the wafer having a surface coating of silicon dioxide constituting a passivation layer, the method of forming the electrodes which method comprises forming a glass layer upon the passivation layer, the glass layer being bonded to the passivation layer, forming windows in the glass layer by etching to expose the passivation layer at areas to which the contacts are to be made, locating green glazed conductors upon the surface of the glass layer with the conductors contacting the exposed areas of the passivation layer, and curing the assembly to bond the glazed conductors to the glass layer, parts of the conductors dispersing through the unbroken passivation layer at said areas, the conductors forming said electrodes.

7. A method of making semiconductor devices comprising the steps of providing a wafer of semiconductor material which is divisible into a plurality of separate elements, each element having at least two regions of different conductivity type;

forming a passivation layer upon the surface of the semiconductor so as to hermetically seal the wafer;

forming a layer of glass over the passivation layer, the glass layer being bonded to the passivation layer;

forming windows in the glass layer by selectively removing glass therefrom to expose separate areas of the passivation layer at said regions respectively;

forming a predetermined pattern of glazed conductors over the surface of the glass layer with each glazed conductor contacting a respective exposed area of the passivation layer;

curing the assembly to bond the glazed conductors to the glass layer, parts of the conductors diffusing through the unbroken passivation layer at said exposed areas;

separating the elements;

providing electrical connections to the conductors; and encapsulating the elements.

8. The method claimed in claim 7, wherein prior to separation of the elements, the wafer is dip-soldered, the elements being subsequently separated, laid upon a ribbon lead in a predetermined orientation, the ribbon lead having a predetermined pattern of metallic connecting strips upon which the glazed conductors of the devices are superimposed and the supeirmposed glazed conductors and connecting strips being joined by solder reflow.

References Cited

UNITED STATES PATENTS

| | | | |
|---|---|---|---|
| 2,560,594 | 7/1951 | Pearson | 29—587 |
| 3,037,180 | 5/1962 | Linz | 29—589 |
| 3,178,804 | 4/1965 | Ullery et al. | 29—577 |
| 3,182,118 | 5/1965 | De Proost et al. | 29—589 |

PAUL M. COHEN, Primary Examiner

U.S. Cl. X.R.

29—587, 589, 620; 148—186